(12) United States Patent
Liu et al.

(10) Patent No.: US 7,686,155 B2
(45) Date of Patent: Mar. 30, 2010

(54) WORKPIECE-TRANSPORTING APPARATUS OF IN-LINE SPUTTERING MACHINE

(75) Inventors: Dean-Kuo Liu, Taipei Hsien (TW); Hung-Hsin Lin, Taipei Hsien (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 239 days.

(21) Appl. No.: 12/050,058

(22) Filed: Mar. 17, 2008

(65) Prior Publication Data

US 2009/0014933 A1    Jan. 15, 2009

(30) Foreign Application Priority Data

Jul. 13, 2007    (CN) .................... 2007 2 0054174 U

(51) Int. Cl.
*B65G 17/32*    (2006.01)
(52) U.S. Cl. ................ 198/377.02; 198/375; 198/377.1
(58) Field of Classification Search .............. 198/465.3, 198/469.1, 377.01, 377.02, 378, 379, 375, 198/377.1
See application file for complete search history.

(56) References Cited

U.S. PATENT DOCUMENTS

| | | | | |
|---|---|---|---|---|
| 2,952,351 A | * | 9/1960 | Stone | 198/377.1 |
| 3,785,853 A | * | 1/1974 | Kirkman et al. | 198/375 |
| 4,776,447 A | * | 10/1988 | Pitcher | 198/394 |
| 5,579,890 A | * | 12/1996 | Harris | 198/377.1 |
| 5,713,405 A | * | 2/1998 | Kashiwagi | 198/378 |
| 6,273,237 B1 | * | 8/2001 | Bazydola et al. | 198/375 |
| 6,435,332 B1 | * | 8/2002 | Price | 198/375 |
| 6,520,314 B1 | * | 2/2003 | Seiling | 198/375 |

* cited by examiner

*Primary Examiner*—James R Bidwell
(74) *Attorney, Agent, or Firm*—WPAT, P.C.; Anthony King; Kay Yang

(57) ABSTRACT

A workpiece-transporting apparatus of in-line sputtering machine includes a conveyer unit and a carrying salver. The conveyer unit has a holder, and a transporting wheel group is arranged in the holder. A conveyer belt covers around the transporting wheel group. A driving wheel group is arranged in one side of the conveyer belt and located in the holder. The driving wheel group connects to a motor and surrounded by a connecting belt. The carrying salver is placed on the conveyer belt of the conveyer unit. The carrying salver has a base, a plurality of supporting shafts are assembled in the base and linked together for being driven together. A workpiece base is arranged on the supporting shafts. At least one of the supporting shafts is surrounded by a supporting wheel. The supporting wheel engages with the connecting belt for being driven by the connecting belt.

9 Claims, 4 Drawing Sheets

WORKPIECE-TRANSPORTING APPARATUS OF IN-LINE SPUTTERING MACHINE

BACKGROUND OF THE INVENTION

1. Field of the Invention

This present invention relates to an in-line sputtering machine, and more specifically to a workpiece-transporting apparatus of in-line sputtering machine.

2. The Related Art

When a workpiece is sputtered in an in-line sputtering machine by a sputtering source as traditions, the workpiece is put on a carrying salver for being conveyed in the in-line sputtering machine. The sputtering source can only sputter along a certain direction, an outer surface of the workpiece is not sputtered entirely and uniformly. As the outer surface of the workpiece is not a plate surface, a sputtering film formed in the outer surface of the workpiece by the in-line sputtering machine is not uniform.

Conventionally, in order to sputter the workpiece uniformly, a transporting apparatus is arranged in the in-line sputtering machine, the carrying salver is arranged in the transporting apparatus, and is driven to rotate by a corresponding motor, so the workpiece can be sputtered in a revolving status.

In the traditional in-line sputtering machine, the workpiece is not easy to hang in the transporting apparatus, therefore, the output efficiency of the traditional in-line sputtering machine is lower, and the transporting apparatus is very complex, then the cost of the transporting apparatus is higher.

SUMMARY OF THE INVENTION

Accordingly, an object of the present invention is to provide a workpiece-transporting apparatus of in-line sputtering machine. The workpiece-transporting apparatus of in-line sputtering machine includes a conveyer unit and a carrying salver. The conveyer unit has a holder, and a transporting wheel group arranged in the holder. A conveyer belt covers around the transporting wheel group. A driving wheel group is arranged alongside of the conveyer belt and located in the holder. The driving wheel group connects to a motor and surrounded by a connecting belt. The carrying salver is placed on the conveyer belt of the conveyer unit. The carrying salver has a base, a plurality of supporting shafts are assembled in the base and linked together for being driven together. A plurality of workpiece bases are arranged on the respective supporting shafts. At least one of the supporting shafts is surrounded by a supporting wheel. The supporting wheel engages with the connecting belt for being driven by the connecting belt.

As above description, when the workpiece-transporting apparatus of in-line sputtering machine working, the transporting wheel group drives the conveyer belt to rotate, and the driving wheel group drives the connecting belt to rotate. Workpieces are put in the workpiece bases, the workpieces and the carrying salvers are put on the conveyer apparatus together, the carrying salvers move with the conveyer belt together. In this moving, the connecting belt drives the supporting wheels, and the supporting wheels drive all the supporting shafts to rotate, then the workpieces rotates with the supporting shafts. The workpieces move ahead and rotate simultaneously, so the workpieces can be sputtered uniformly.

BRIEF DESCRIPTION OF THE DRAWINGS

The invention, together with its objects and the advantages thereof may be best understood by reference to the following description taken in conjunction with the accompanying drawings, in which.

DETAILED DESCRIPTION OF THE PREFERRED EMBODIMENT

Figure 1:
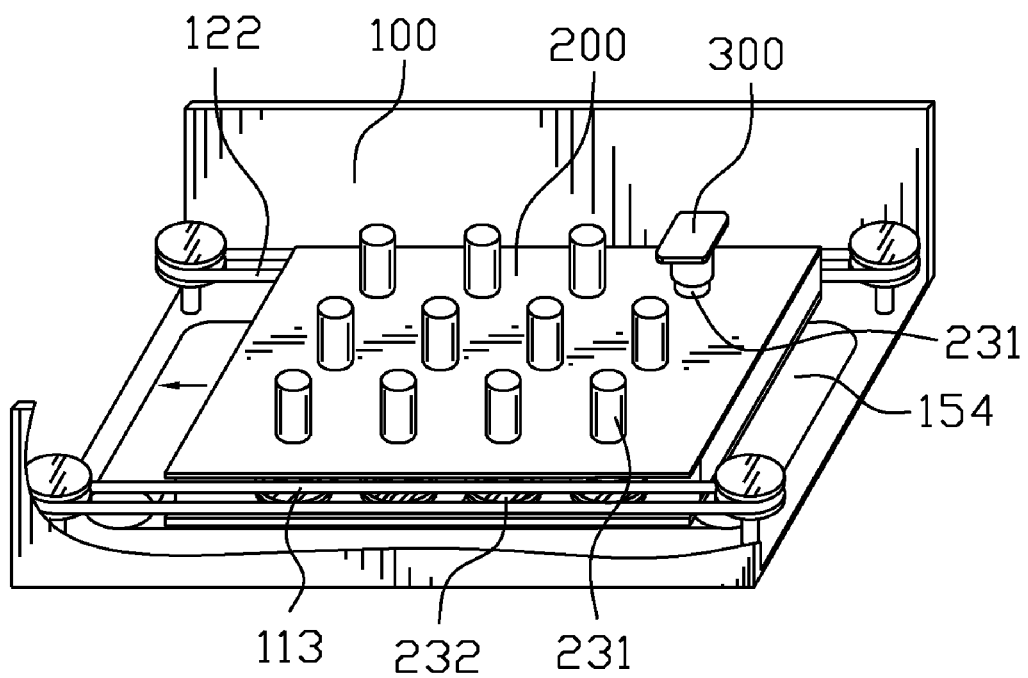
FIG. 1 is a perspective view of a workpiece-transporting apparatus in-line sputter machine, a holder of a conveyer unit is dissected partly.

With reference to FIG. 1, a workpiece-transporting apparatus of in-line sputtering machine 10 includes a plurality of conveyer units 100 (in this embodiment, only one of the conveyer units is shown in FIG. 1) and a carrying salver 200 transported in the conveyer units 100. The conveyer units 100 are serially connected in a line to form a conveyer apparatus.

Figure 2:
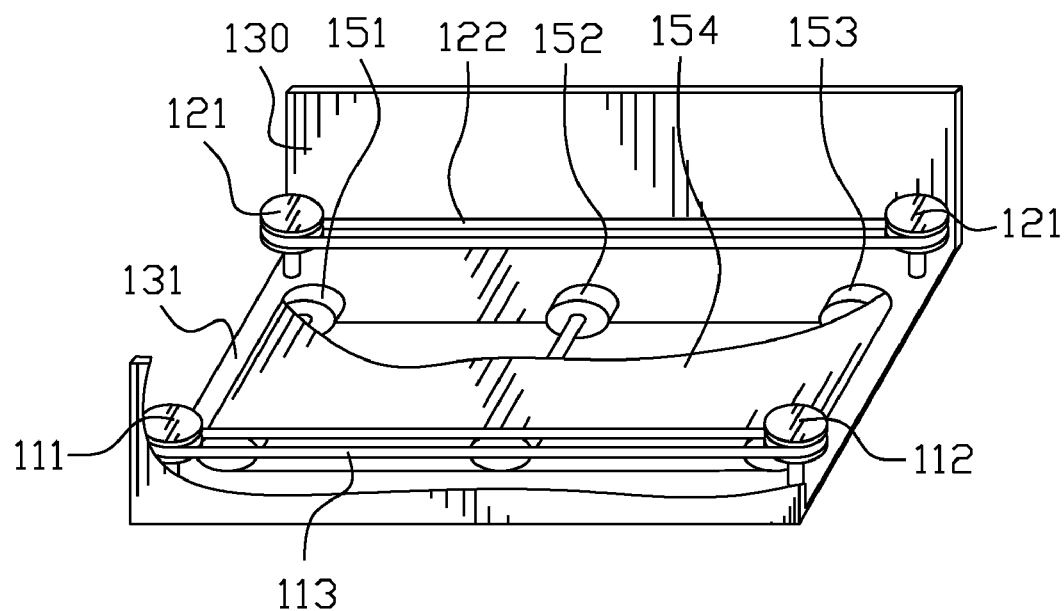
FIG. 2 is a perspective view of the conveyer unit in FIG. 1, the holder and a conveyer belt are dissected partly.

Please refer to FIG. 2, the conveyer unit 100 includes a holder 130, the holder 130 has a holding base 131 showing a rectangle shape. An impelling wheel 151 is arranged in a left end of the holding base 131. The impelling wheel 151 connects with a motor (not shown). A following wheel 153 is arranged in a right end of the holding base 131. A middle wheel 152 is arranged in the middle of the holding base 131 and located between the impelling wheel 151 and the following wheel 153. The impelling wheel 151, the middle wheel 152 and the following wheel 153 compose a transporting wheel group. A conveyer belt 154 covers around the transporting wheel group and can be driven by the transporting wheel group.

The left end and the right end of the holding base 131 arrange a driving wheel 111 and a driven wheel 112 respectively, the driving wheel 111 and the driven wheel 112 are arranged in the front of the conveyer belt 154. The driving wheel 111 connects a motor (not shown). A connecting belt 113 covers around the driving wheel 111 and the driven wheel 112. The driving wheel 111 and the driven wheel 112 compose a driving wheel group.

Two auxiliary wheels 121 are arranged in the left end and the right end of the holding base 131 respectively. An auxiliary belt 122 covers around the auxiliary wheels 121. The two auxiliary wheels 121 compose an auxiliary wheel group located in the rear of the conveyer belt 154.

Figure 3:
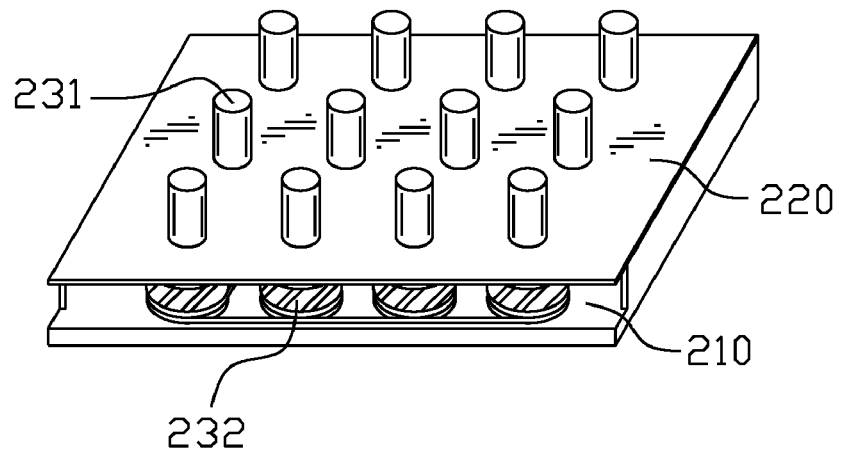
FIG. 3 is a perspective view of a carrying salver in FIG. 1.
Figure 4:
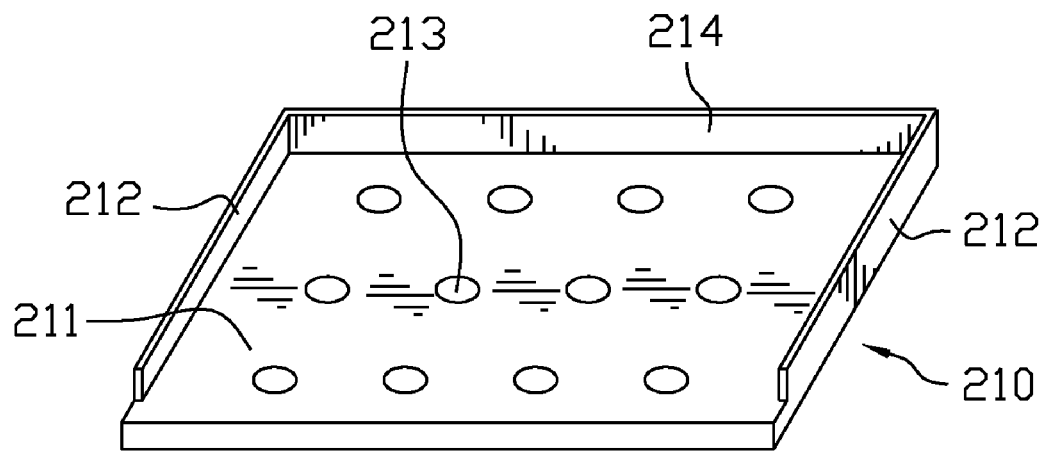
FIG. 4 is a perspective view of a base in FIG. 3.

Referring to FIGS. 3 and 4, the carrying salver 200 includes a base 210. The base 210 has a bottom board 211 showing a square shape. Twelve accommodating grooves 213 are opened in the bottom board 211 in 3×4 matrix to form three transverse row in the left-to-right direction and four longitudinal row in the front-to-rear direction. Two sidewalls 212 are arranged in a left end and a right end of the bottom board 211. A gap is formed between a front end of the sidewall 212 and the bottom board 211. A rear wall 214 is formed in a rear end of the bottom board 211 and connects the sidewalls 212.

Figure 6:
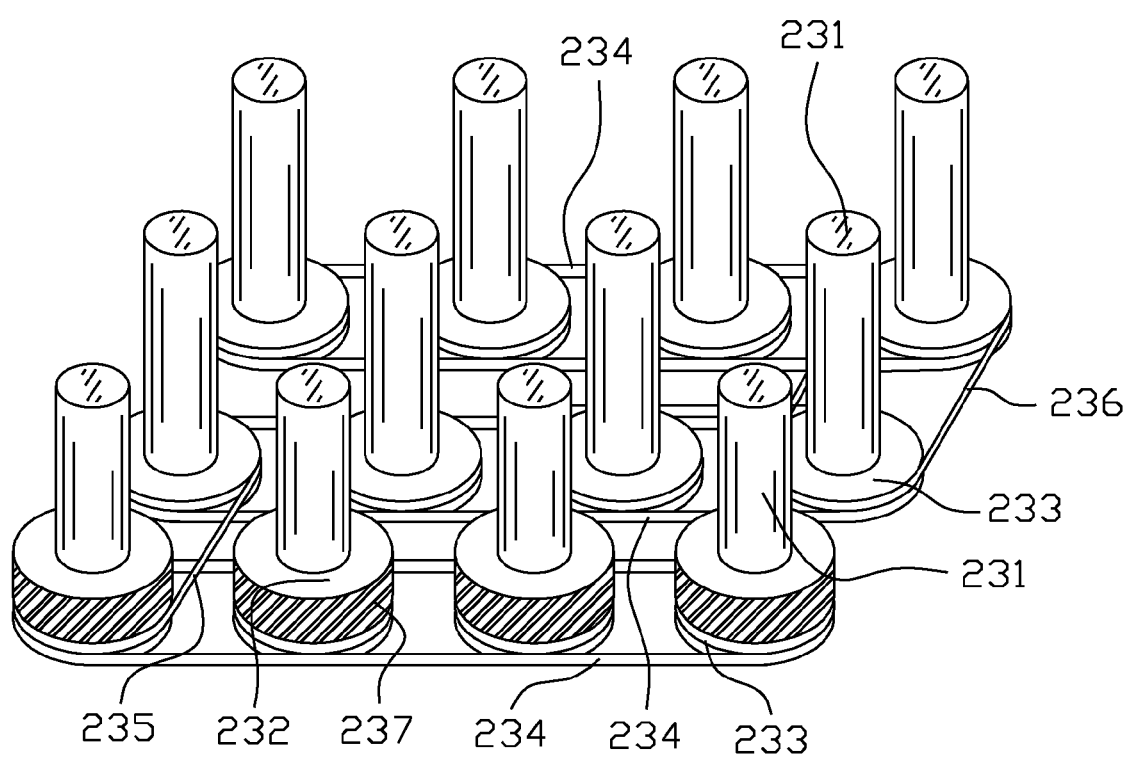
FIG. 6 shows the transmission relation of a plurality of supporting shafts in FIG. 3.

In FIGS. 3 and 6, the twelve accommodating grooves 213 are used to receive a supporting shaft 231 respectively. Each of the supporting shafts 231 has a belt wheel 233, an upper belt groove and a lower belt groove are opened in the belt wheel 233. A first belt 234 covers around the four belt wheels 233 in each of the transverse rows and is placed in the lower belt grooves of the four belt wheels 233 in each of the transverse rows. A second belt 235 covers around two of the belt wheels 233 in one of the longitudinal rows closest to the left end of the bottom board 211 and is placed in the upper belt grooves of the two belt wheels 233. The two belt wheels 233 covered by the second belt 235 are adjacent to each other and closer to a front end of the bottom board 211 than the else one in the same longitudinal row. A third belt 236 covers around two of the belt wheels 233 in another of the longitudinal rows closest to the right end of the bottom board 211 and is placed in the upper belt grooves of the two belt wheels 233. The two belt wheels 233 covered by the third belt 236 are adjacent to each other and closer to the rear end of the bottom board 211 than the else one in the same longitudinal row. Four supporting wheels 232 are respectively placed on the four belt wheels 233 in the transverse row closest to the front end of the bottom board 211 and around the corresponding supporting shaft 231. Some strips 237 are carved around the supporting wheel 232, while the connecting belt 113 drives the supporting wheels 232, the strips 237 enhances the friction between the connecting belt 113 and the supporting wheel 232.

Figure 5:
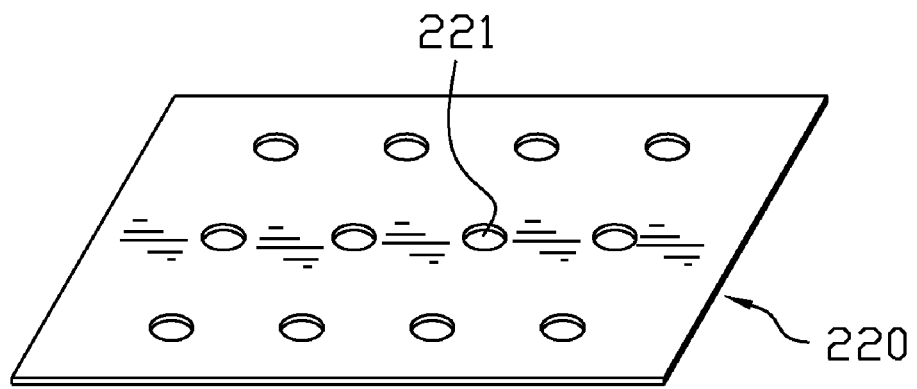
FIG. 5 is a perspective view of a cover in FIG. 3.

With reference to FIGS. 3 and 5, a cover 220 is arranged on the base 210. The cover 220 is a rectangular board shape and supported by the sidewalls 212 and the rear wall 214. The size of the cover 220 corresponds to the bottom board 211 of the base 210. A plurality of fixing holes 221 are opened in the cover 220. The supporting shafts 231 pass through the fixing holes 221. The cover 220 shields the belt wheels 233, the first belts 234, the second belt 235, the third belt 236 and the supporting wheels 232 to avoid the elements being polluted by sputtering material.

Please refer to FIG. 1 again, the carrying salver 200 is placed on the conveyer belt 154 of the conveyer unit 100 and located between the connecting belt 113 and the auxiliary belt 122. When the carrying salver 200 moves on the conveyer belt 154 from right to left, the rear end of the carrying salver 200 resists the auxiliary belt 122, and the supporting wheels 232 of the carrying salver 200 resist the connecting belt 113. A workpiece base 300 is arranged on the supporting shaft 231 for fastening a workpiece easily. Furthermore, the workpiece base 300 can be changed according to the shape of the workpiece.

When the workpiece-transporting apparatus of in-line sputtering machine 10 working, the motors drive the impelling wheel 151 of the conveyer unit 100 and the driving wheel 111 firstly, the impelling wheel 151 drives the conveyer belt 154, and the driving wheel 111 drives the connecting belt 113, and then the workpieces are fastened on the workpiece bases 300, the carrying salver 200 moves together with the conveyer belt 154. In this movement, the connecting belt 113 drives the supporting wheels 232, and the supporting wheels 232 drive the supporting shafts 231 by the belt wheels 233, the first belts 234 and the second belt 235 and the third belt 236. The workpieces rotate with the workpiece bases 300. The workpieces move ahead and rotate simultaneously, so the workpieces can be sputtered uniformly.

As above description, the motor drives the driving wheel 111 to rotate, then the driving wheel 111 drives the connecting belt 113. Then, the supporting wheels 232 are driven by the connecting belt 113 under the friction between the connecting belt 113 and the supporting wheel 232 and then drive the else belt wheels 233 to rotate by the first belts 234, the second belt 235 and the third belt 236. Therefore, all of the belt wheels 233 of the carrying salver 200 just need one motor, the number of the motors are greatly reduced in the workpiece-transporting apparatus of in-line sputtering machine 10. Furthermore, because of the design of the workpiece base 300, the workpiece is easy to hang in the workpiece-transporting apparatus of in-line sputtering machine 10. In conclusion, the output efficiency of the workpiece-transporting apparatus of in-line sputtering machine 10 is increased, and the structure of the workpiece-transporting apparatus of in-line sputtering machine 10 is simple, the cost of the workpiece-transporting apparatus of in-line sputtering machine 10 is reduced.

An embodiment of the present invention has been discussed in detail. However, this embodiment is merely a specific example for clarifying the technical contents of the present invention and the present invention is not to be construed in a restricted sense as limited to this specific example. For example, the auxiliary wheel group and the auxiliary belt can be replaced by a driving wheel group and a connecting belt, in this condition, the rotating directions of the wheel groups are opposite, and the rotating speeds are equal, the supporting shafts can be arranged in the base. The belt driving can be replaced by chain driving. Thus, the spirit and scope of the present invention are limited only by the appended claims.

What is claimed is:

1. A workpiece-transporting apparatus of in-line sputtering machine, comprising:

a conveyer unit, the conveyer unit having a holder, a transporting wheel group being arranged in the holder, a conveyer belt covering around the transporting wheel group, a driving wheel group being arranged alongside of the conveyer belt and located in the holder, the driving wheel group connecting a motor and being surrounded by a connecting belt; and a carrying salver placed on the conveyer belt of the conveyer unit, the carrying salver having a base, a plurality of supporting shafts assembled in the base and linked together for being driven together, and a plurality of workpiece bases arranged on the respective supporting shafts, at least one of the supporting shafts being surrounded by a supporting wheel, the supporting wheel engaging with the connecting belt for being driven by the connecting belt.

2. The workpiece-transporting apparatus of in-line sputtering machine as claimed in claim 1, wherein the transporting wheel group includes an impelling wheel connecting a motor and a following wheel, the impelling wheel and the following wheel are arranged in two ends of the holder.

3. The workpiece-transporting apparatus of in-line sputtering machine as claimed in claim 1, wherein the driving wheel group includes a driving wheel and a driven wheel, the driving wheel and the driven wheel are arranged in two ends of the holder, the driving wheel connects the motor.

4. The workpiece-transporting apparatus of in-line sputtering machine as claimed in claim 3, wherein the conveyer unit further comprises an auxiliary wheel group disposed in the holder and located alongside of the conveyer belt and opposite the driving wheel group, the auxiliary wheel group includes two auxiliary wheels, the auxiliary wheels are arranged in two ends of the holder and covered by an auxiliary belt.

5. The workpiece-transporting apparatus of in-line sputtering machine as claimed in claim 1, wherein the supporting shafts are matrix-arranged in the base of the carrying salver, a row of the supporting shafts near the connecting belt are respectively surrounded by one supporting wheels for engaging with the connecting belt.

6. The workpiece-transporting apparatus of in-line sputtering machine as claimed in claim 1, wherein the base has a bottom board, two ends of the bottom board extends upward to form two sidewalls, a gap is formed at one end of each of the sidewalls for accommodating the connecting belt, a rear wall extends upward from the bottom board and connects the other ends of the sidewalls.

7. The workpiece-transporting apparatus of in-line sputtering machine as claimed in claim 6, wherein the carrying salver further comprises a cover supported by the sidewalls and the rear wall, a plurality of fixing holes are defined in the cover, the supporting shafts pass through the respective fixing holes.

8. The workpiece-transporting apparatus of in-line sputtering machine as claimed in claim 1, wherein the supporting wheel defines a plurality of strips therearound for enhancing the friction between the connecting belt and the supporting wheel.

9. The workpiece-transporting apparatus of in-line sputtering machine as claimed in claim 1, wherein the supporting shafts are linked together by belts or chains.

\* \* \* \* \*